United States Patent [19]

Rosenfeld

[11] 3,904,996

[45] Sept. 9, 1975

[54] CAPACITIVE WEIGHTED ACOUSTIC SURFACE WAVE FILTER

[75] Inventor: Ronald C. Rosenfeld, Richardson, Tex.

[73] Assignee: Texas Instruments, Incorporated, Dallas, Tex.

[22] Filed: Dec. 28, 1973

[21] Appl. No.: 429,259

[52] U.S. Cl..................... 333/72; 310/9.8; 333/30 R

[51] Int. Cl.².. H03H 9/02; H03H 9/06; H03H 9/32; H01L 41/10

[58] Field of Search....... 333/30 R, 70 T, 72; 310/8, 310/8.1, 9.7, 9.8

[56] References Cited

UNITED STATES PATENTS 3,582,540 6/1971 Adler et al....................... 333/72 X 3,688,223 8/1972 Pratt et al........................... 333/72

*Primary Examiner*—James W. Lawrence
*Assistant Examiner*—Marvin Nussbaum
*Attorney, Agent, or Firm*—Harold Levine; James T. Comfort; William E. Hiller

[57] ABSTRACT

A new technique for weighting acoustic surface wave filter interdigital transducers in which transducer pads are first deposited on a substrate, a dielectric layer deposited thereover and interdigital fingers deposited atop the dielectric layer with the fingers having a variable and selectable area where they overlap the dielectric to thereby effectively vary the amount of capacitive coupling of each finger and resulting in an acoustic wave which is uniform across its beam width.

6 Claims, 9 Drawing Figures

CAPACITIVE WEIGHTED ACOUSTIC SURFACE WAVE FILTER

BACKGROUND OF THE INVENTION

This invention relates to acoustic surface wave devices in general and more particularly to an improved method of weighting an acoustic surface wave filter. Surface wave acoustic devices are gaining wide-spread use as filters, delay lines and the like. In particular, in frequency ranges between 10 mhz and 1 ghz, devices which are compact and provide numerous advantages over inductive-capacitive type filters and tuned electromagnetic wave guides are possible. This results directly from the fact that acoustic waves travel at a much slower speed than electromagnetic waves and thus, the size of a structure can be correspondingly smaller in the order of $10^5$.

When used in filtering applications these devices generally comprise a piezoelectric substrate on which are deposited two spaced transducers. The most common type of transducer used is what is known as the interdigital transducer wherein a plurality of fingers extend from a transducer pad on each side of the substrate and have overlapping portions. Electric fields created between the overlapping fingers of the transducer excite the piezoelectric material to generate the surface waves. In order to obtain the proper filter response, weighting of the interdigital fingers is necessary. The manner of designing such filters is described in a paper published in the IEEE Transactions on Microwave Theories and Techniques entitled "Impulse Model Design of Acoustic Surface Wave Filters" by C. S. Hartmann, D. T. Bell, Jr., and R. C. Rosenfeld, Vol. MTT-21 No. 4, April, 1973, p.p. 162–175. In the design method described therein, the impulse response is used with the desired frequency response converted into a time response through the use of Fourier transforms and the weighting then done in accordance with the time response obtained. The most common method of obtaining weighting is through the use of variable overlap in which the overlap pattern essentially follows the type of response required. A transducer of this nature results in a surface wave which has a constant amplitude but a non-uniform beam width. The wave is transmitted through the piezoelectric material to a second transducer which will have voltages induced therein in accordance with the transmitted wave.

Ideally, it is desirable to have half of the filtering done by each of the two transducers. In practice, however, such is not possible unless a multi-strip coupler is placed between the two transducers. An arrangement such as this is shown in the above identified article. When using such couplers, the two transducers must be off-set and the device becomes larger and suffers from greater losses.

Although transducers weighted in this manner operate fairly well, they do suffer from a number of disadvantages. The uneven overlap in such filters results in diffraction effects which can severely degrade the response of certain high performance filters. This diffraction is an effect in which the wave fronts from the smaller overlapping pairs tend to not move in a planar beam but, tend to have a beam which becomes circular which, when it intersects the other transducers, will result in a distorted output, i.e., the waves become like the waves emanating from a point source and could be analogized to the ripples formed when a stone is thrown in the water. With large overlap, such does not occur and the wave is more likely to have a straight front avoiding such distortion effects. In addition, the electric fields between the fingers extend beyond the fingers creating undesirable effects. If all fingers are of the same overlap, these effects may be easily corrected. However, unequal overlap results in varying fields at the ends, also known as fringing fields. In addition, analysis of variable overlap fingers, also known as apodized fingers, requires that each transducer must be "channeled" and each channel analyzed separately. Also, as noted above, in order for both the input and output transducers to be weighted, multi-strip couplers must be used. Because of the number of electrodes involved, these multi-strip couplers cannot be used in a practical device which is constructed on a low coupling substrate such as quartz.

Another type of weighting is known as the finger removal technique, in which sets of fingers are removed to come up with an average which is equal to the desired response. All fingers in this type of device are of the same length but groups of fingers are selectively removed to obtain the desired response. Although such weighting overcomes some of the problems noted above, it creates other problems, particularly in that smooth weighting is difficult to obtain.

Thus, it can be seen that there is a need for an improved weighting technique which avoids the disadvantages of these different types of prior art weighting techniques to obtain a better filter.

SUMMARY OF THE INVENTION

The present invention provides a new weighting technique. Rather than weighting by means of variable overlap or by selective finger removal, the present invention uses fingers having equal overlap and obtains weighting through a variable capacitive coupling to each of the individual fingers. Two transducer pads are first deposited on a piezoelectric substrate, over which is placed a dielectric layer. The fingers are then deposited with the portion of the finger overlapping the dielectric and thus, forming the weighting capacitor or pad which gives the desired weighting. The result is a surface wave having a uniform beam width but having variable amplitude. That is, the amount of energy picked up by the receiving transducer will be a function of the product of the amplitude of the surface wave and its beam width. The prior art devices control beam width to obtain the desired response while maintaining constant amplitude. In the present invention on the other hand, beam width is kept constant while the amplitude is varied through the use of capacitive coupling. The result of this weighting technique is that both input and output transducers may be weighted with no difficulty since the beam width is uniform. In addition, since all finger overlaps are equal, the above mentioned diffraction effects are substantially eliminated as are the fringing effects. The insertion loss associated with apodized fingers is eliminated and analysis of the filter is simplified since the capacitively weighted filter does not need to be channeled and each channel analyzed separately as in the apodized filter. In comparison to the finger removal technique, much smoother weighting can be obtained.

In the preferred embodiment, extra fabrication steps are required in that a transducer pad and a dielectric layer must be deposited before the deposit of the finger whereas in the prior art device, only one step of depositing the fingers and pad was required. However, these steps are all well known steps commonly used in the manufacture of semiconductor devices, and the extra effort involved is minimal. For example, the same techniques which are used for producing thin film tantalum oxide and anodized tantalum capacitors in microcircuits can be used in the present invention. In addition, a second embodiment in which the capacitors are formed in a single step is also shown. The filters made according to the present invention have a somewhat increased electrical Q. However, it has been shown that this increase is not significant as long as the capacitance of the largest weighting capacitor is much larger than the capacitance of an individual finger in the transducer, i.e., the capacitance between two opposite fingers. The capacitor introduces a small amount of phase shift which, in some cases, must be compensated for. In filters using quartz as a substrate, such phase shift has been found to be negligible and the phase shift in a substrate of $LiNbO_3$ almost negligible. Although the possibility of capacitor shorting due to pin holes is a possibility, the yield for thin film capacitors is presently of the order of 99% for capacitors on a two inch slice and thus, the required capacitors can be reliably produced. The capacitance will, of course, depend to some degree on the thickness of the dielectric. However, the present state of the art in manufacturing capacitors of this nature indicates that control within 5% is possible on a production line, which accuracy is sufficient for the present device.

A further alternate embodiment of the invention contemplates the replacement of the dielectric layer with resistive material. In this embodiment, the filter Q is not increased. The use of resistance coupling however, will result in additional loss, which may in some applications be tolerable. Furthermore, an inductor may be placed in series with each finger using available techniques and will result in a further advantage in that an external inductor may not be needed for matching the transducer. However, in most cases, this would not be practical because of fabrication and size problems.

DETAILED DESCRIPTION OF THE PREFERRED EMBODIMENT

Figures 1, 2, 4:
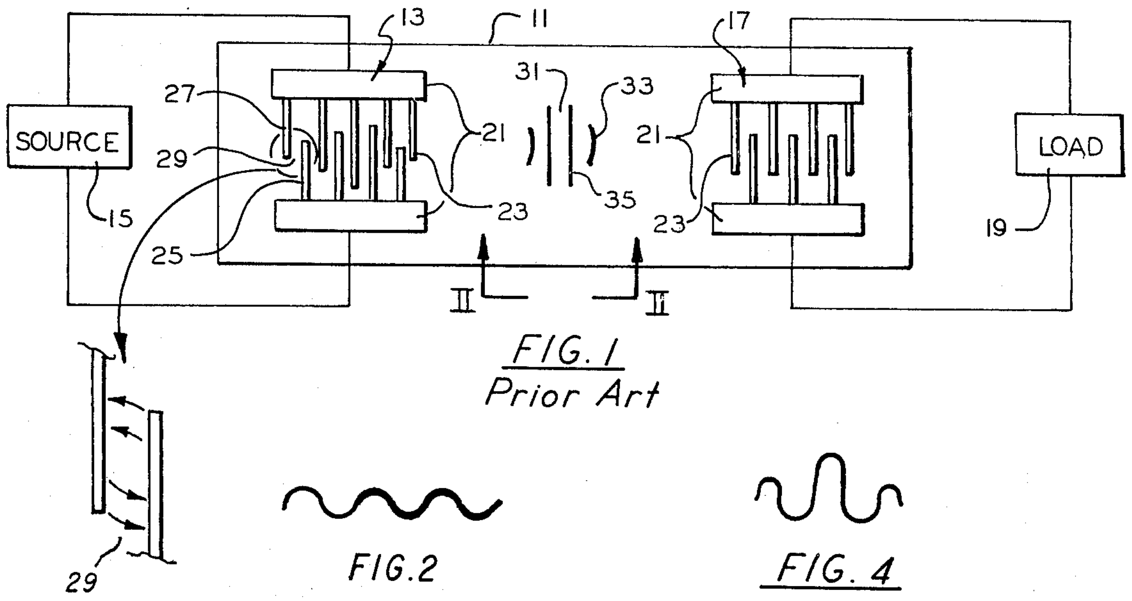
FIG. 1 Prior Art, FIG. 2, FIG. 4
FIG. 1 is a plan view partially in schematic form illustrating a prior art apodized filter.
FIG. 2 is a waveform diagram illustrating the amplitude of the wave of the filter of FIG. 1.
FIG. 4 illustrates the wave associated with the filter of FIG. 3.

FIG. 1 illustrates a typical prior art filter arrangement such as those described in the above referenced paper. As shown on FIG. 1, transducers are deposited on each end of a substrate 11. Thus, there is shown an interdigital transducer 13 connected to a source 15 at one end and an interdigital transducer 17 connected to a load 19 at the other end. Each of the transducers includes a pair of transducer pads 21 from which extend a plurality of overlapping interdigital fingers 23. The transducer 13 has its interdigital fingers apodized or weighted by overlapping as is apparent from the FIGURE. The voltages induced on opposite fingers, for example, fingers 25 and 27, will result in an electric field therebetween which will excite the piezoelectric material to induce acoustic surface waves therein. The electric field will have fringes such as that indicated as 29 on the FIGURE i.e., the electric field will extend from the ends of the fingers over to the next finger. This effect will vary much more in a filter weighted in this manner than in the transducer 17 at the other end, wherein equal overlap is present. Also shown on FIG. 1 is a representation 31 of the type of wave produced by the transducer 13. The wave essentially takes the shape of the transducer overlap pattern. Those pairs which have small overlap result in wave fronts which have a tendency to be subject to diffraction effects as is illustrated by the wave front 33. Since the pair overlap from which it was generated begins to approach a point source, this wave front tends to radiate equally in all directions rather than in a straight line as does the wave front indicated as 35.

The amplitude of the wave will be constant as indicated by FIG. 2 which represents a cross-sectional elevation view looking at the wave 31 along the lines II—II. As noted above, to properly pick up a wave such as wave 31, the interdigital transducer 17 must have fingers of equal length and thus, without the use of other measures such as multi-strip couplers, weighting of both transducers is not possible in this arrangement.

Figure 3:
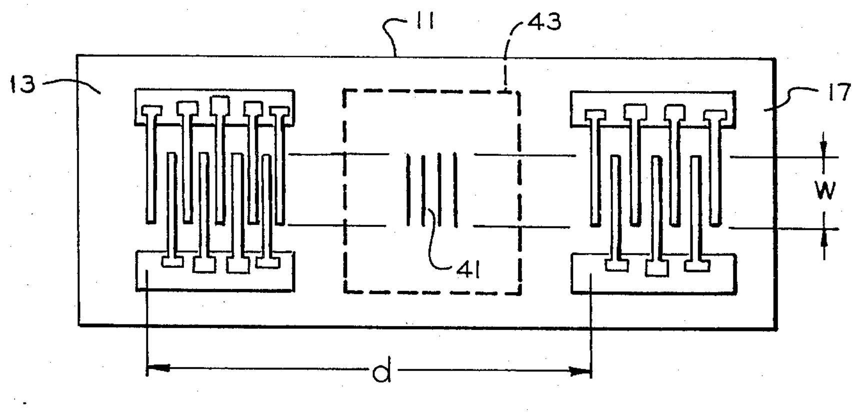
FIG. 3 is a plan view of a filter according to the present invention.

FIG. 3 illustrates the transducer of the present invention and the type of wave formed thereby, with similar parts given identical reference numerals to FIG. 1. In this embodiment, the transducers 13 and 17 on substrate 11, each have fingers of constant overlap but which are capacitively weighted as will be described below. The result is a wave indicated by 41 which has a constant beam width. Because of the constant beam width, weighting of both transducers is possible. In addition, the fringing problems and the diffraction effect associated with the wave front 33 above are not present. As long as the distance between transducers is not too large with respect to the beam width, diffraction will not be significant. In this regard, the width of overlap indicated as w on FIG. 3, which is also the beam width, should be made to be many wavelengths long in well-known fashion. In a transducer of this nature, the finger spacing will be equal to the wavelength to be reproduced in well-known fashion i.e., the wavelength $\lambda$ corresponding to the center frequency of the filter. The substrate should be at least $10 \times \lambda$ thick and the distance $d$ between transducers approximately equal to twice the thickness. Below the center portion of the substrate a short circuit plate 43 may be deposited in conventional fashion to reduce cross-talk.

FIG. 4 illustrates the type of wave generated by the arrangement of the present invention. Unlike the wave of FIG. 2 which is of constant amplitude, the wave is of variable amplitude with the amplitude following the desired response pattern just as the beam width did in the prior art embodiment. The result at the output transducer is approximately equivalent since the resulting energy will be a function of the product of beam width and amplitude.

Figure 5A:
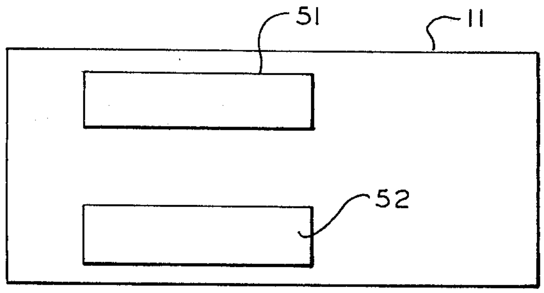
FIGS. 5*a*, *b* and *c* are plan views illustrating the steps followed in making the transducers on the filter of FIG. 3.

FIGS. 5*a*, *b*, and *c* illustrate the process used in making a transducer according to the present invention. A substrate which may, for example, be quartz or $LiNbO_3$ will be prepared in conventional fashion. Upon the substrate is deposited a pair of transducer pads 51 and 52. These may be deposited in any well-known manner such as by evaporation or sputtering. Over the major portion of the deposited transducer pads 51 and 52, is deposited a dielectric material using well-known techniques such as those used in producing thin film capacitors. These dielectric layers indicated as 53 will cover all except the edges 54 and 55 which will allow space for external leads to be connected to the transducer pads. In the final step, over the pads and dielectric, are deposited fingers 57, each of equal length as they extend out from the edge of the dielectric end pads but each having a selected size on their end portion indicated by the reference numeral 59. This end portion 59 will result in a capacitor being formed between itself and its respective transducer pad which has a weighting capacitance which is expressed by:

$$C_w = \frac{\epsilon A}{t}$$

where $\epsilon$ is the permittivity of the dielectric and $t$ the thickness of the dielectric and $A$ the area of the end portion 59.

In selecting the capacitor sizes, techniques similar to that described in the above referenced paper are used with weighting done as a function of the impulse response of the filter. Thus, rather than varying overlap, the weighting is done through varying the capacitor which couples the finger to the source. The capacitor results in a voltage drop which reduces the voltage between adjacent fingers and thereby reduces the driving strength of the electric field provided thereby. Thus, the magnitude of the finger weighting is controlled by its capacitance which is in turn a function directly of the area of the portion 59 since each of the other parameters in the capacitance equation remain constant.

Figure 6:
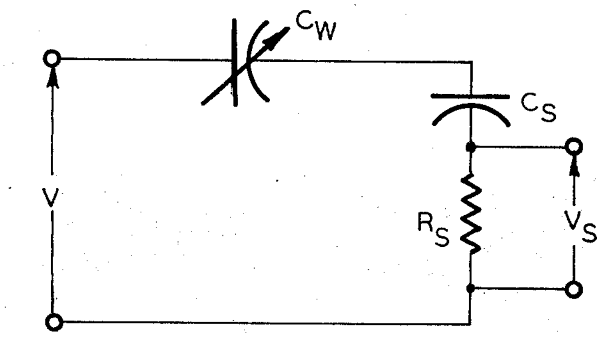
FIG. 6 is a schematic diagram of the equivalent circuit of a single finger pair of the filter of FIG. 3.

FIG. 6 illustrates an equivalent circuit of a weighted finger. This model assumes a weak coupling approximation in that the performance of an individual finger does not depend on the number or location of other fingers. As illustrated on FIG. 6, $C_w$ is the weighting capacitor which can be varied from finger to finger with $C_s$ and $R_s$ representing the series equivalent capacitance and radiation resistance of the finger and V the source voltage. The amplitude of the acoustic surface wave is proportional to the voltage $V_s$ which is given by the following equation:

$$\frac{V_s}{V} = \frac{R_s}{\left[R_s^2 + \frac{1}{\omega 2}\left(\frac{1}{C_w} + \frac{1}{C_s}\right)^2\right]^{1/2}}$$

The phase of the voltage $V_s$ is represented by:

$$\phi = \tan^{-1} \frac{1}{\omega R_s}\left(\frac{1}{C_w} + \frac{1}{C_s}\right)$$

It has been shown that the phase shift caused by the weighting capacitor is negligible on quartz and almost negligible on $LiNbO_3$. Also, although the weighting capacitor increases the filters electrical Q, this increase has been found not to be significant as long as the capacitance of the largest weighting capacitor e.g., the capacitor formed by the end 61 on FIG. 5*c*, is much larger than the capacitance of an individual finger or more correctly, the capacitance between two fingers such as that between the fingers 63 and 65. Note that this will almost always be the case since the cross-sectional area of the fingers facing each other will be relatively small.

Figure 7:
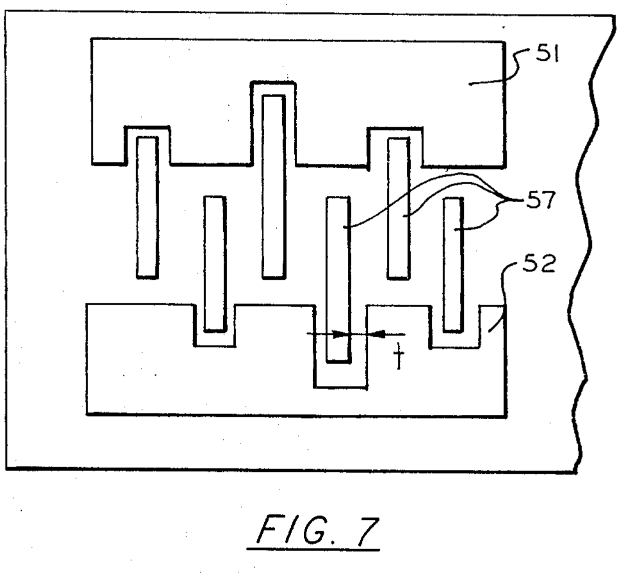
FIG. 7 is a plan view of an alternate embodiment of the invention.

FIG. 7 illustrates an alternate embodiment of the invention which permits depositing the capacitively weighted fingers all at once. In this arrangement, the pads 51 and 52 are horizontally separated from the fingers 57 rather than vertically separated as in the embodiment of FIG. 5. Thus, in depositing the arrangement, a mask is used which separates the fingers 57 from the pads 52, with indentations being formed in the pads and spacing between the indentations and fingers used to provide the desired capacitance. Capacitance here is dependent on the dimensions of the indentations and the width indicated by $t$ on FIG. 7. However, the calculation is more complex than the parallel-plate calculation used above. Because of the small capacitance per unit length between the finger and indentation, relatively large distances will possibly be required thereby materially increasing the size of this arrangement and possibly making its use less desirable than the embodiments of FIG. 5 even though that embodiment requires additional processing steps.

Figure 5B:
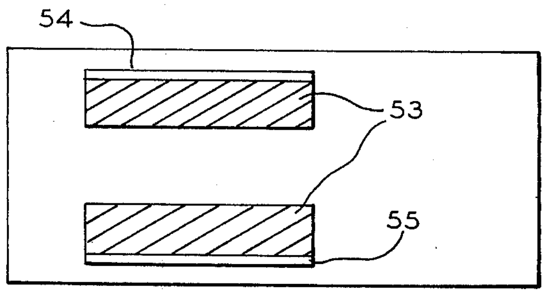
Figure 5C:
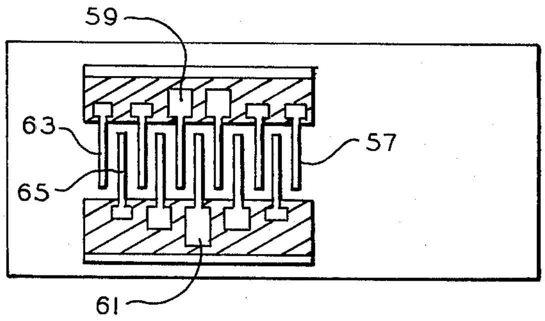

In other embodiments, it is also possible for the coupling between the pads 51 and 52 and the fingers 57 of FIG. 5 to be resistive or inductive. In each case, conventional techniques may be used to interpose either a resistor or inductor between the pads and the respective fingers with the impedence thereof selected according to the required weighting.

In some cases it may prove advantageous to short some of the fingers to the bonding pads instead of coupling them to the pads through weighting capacitors. Alternatively, it may also be advantageous to leave some of the fingers floating, that is, neither coupled to the pad through weighting capacitors nor shorted to the pad. Shorting a finger to the pad, may in some cases decrease the value required for the largest weighting capacitor which makes fabrication easier. Floating a finger is an alternative to fabricating an extremely small weighting capacitor. This also makes fabrication easier. Also the weighting technique can be used in conjunction with other weighting techniques. That is, capacitive weighting could be used in the same transducers with overlap weighting or finger withdrawal mentioned above, or with other weighting techniques not previously mentioned such as phase weighting where the weighting is accomplished by varying the spacing between the electrodes. These and other modifications may be made without departing from the spirit of the invention which is intended to be limited solely by the appended claims.

What is claimed is:

1. An acoustic surface wave filter including at least one weighted transducer comprising:

substrate means including at least one surface of piezoelectric material, an interdigital acoustic surface wave transducer disposed on said at least one surface of piezoelectric material, said transducer including first and second transducer pads disposed on said piezoelectric surface in aligned spaced apart relationship, a first plurality of fingers disposed on said piezoelectric surface and operably associated with said first transducer pad, a second plurality of fingers disposed on said piezoelectric surface and operably associated with said second transducer pad, said second plurality of fingers being parallel to and interdigitated with said first plurality of fingers so as to have overlapping finger portions, means defining respective capacitive relationships coupling the individual fingers included in said first plurality of fingers to said first transducer pad, means defining respective capacitive relationships coupling the individual fingers included in said second plurality of fingers to said second transducer pad, and said capacitive relationship-defining means being selected to provide a predetermined weighting to the interdigitated first and second pluralities of fingers for obtaining a desired impulse response.

2. An acoustic surface wave filter as set forth in claim 1, wherein said overlapping finger portions of said first and second pluralities of fingers are of equal lengths.

3. An acoustic surface wave filter as set forth in claim 2, wherein said first and second transducer pads contain indentations into which corresponding fingers extend with the fingers being spaced from the indentation-defining transducer pad portions such that the opposing edges of the fingers and the indentation-defining transducer pad portions form capacitors comprising said capacitive relationship-defining means.

4. An acoustic surface wave filter as set forth in claim 2, wherein said capacitive relationship-defining means comprises respective layers of dielectric material disposed over each of said first and second transducer pads, a portion of each finger in said first and second pluralities of fingers overlying a portion of the dielectric layer associated with its respective transducer pad to form capacitors, and the size of the portion of each finger overlying the respective dielectric layer being determinative of the capacitive coupling of that finger to the transducer pad corresponding thereto.

5. An acoustic surface wave filter as set forth in claim 4, wherein the sizes of the portions of said fingers overlying the respective said dielectric layer are varied to obtain a desired impulse response.

6. An acoustic surface wave filter as set forth in claim 5, further including a second interdigital acoustic surface wave transducer disposed on said at least one piezoelectric surface of said substrate means, said second transducer also being weighted in the manner of the first transducer, and the total predetermined weighting for the acoustic surface wave filter being divided between said first and second transducers.

* * * * *